(12) United States Patent
Husko

(10) Patent No.: US 11,133,433 B2
(45) Date of Patent: Sep. 28, 2021

(54) HYBRID PHONON-ENHANCED OPTICAL ABSORBERS AND EMITTERS

(71) Applicant: UCHICAGO ARGONNE, LLC, Chicago, IL (US)

(72) Inventor: Chad Husko, Wauconda, IL (US)

(73) Assignee: UCHICAGO ARGONNE, LLC, Chicago, IL (US)

(*) Notice: Subject to any disclaimer, the term of this patent is extended or adjusted under 35 U.S.C. 154(b) by 0 days.

(21) Appl. No.: 16/751,729

(22) Filed: Jan. 24, 2020

(65) Prior Publication Data

US 2020/0264097 A1    Aug. 20, 2020

Related U.S. Application Data

(60) Provisional application No. 62/807,028, filed on Feb. 18, 2019.

(51) Int. Cl.
*H01L 33/04* (2010.01)
*H01L 31/0352* (2006.01)

(52) U.S. Cl.
CPC ...... *H01L 33/04* (2013.01); *H01L 31/035209* (2013.01)

(58) Field of Classification Search
None
See application file for complete search history.

(56) References Cited

U.S. PATENT DOCUMENTS

| | | | |
|---|---|---|---|
| 2014/0216555 A1* | 8/2014 | Aydil | H01L 31/1864 136/264 |
| 2015/0162476 A1* | 6/2015 | Doty | B82Y 20/00 136/255 |
| 2017/0229589 A1* | 8/2017 | Choi | C01B 33/023 |
| 2020/0003899 A1* | 1/2020 | Lungenschmied | H01L 31/03044 |
| 2020/0176618 A1* | 6/2020 | Ahn | H01L 31/0368 |
| 2021/0020744 A1* | 1/2021 | Duan | H01L 21/7806 |

OTHER PUBLICATIONS

"High Performance Molybdenum Disulfide Amorphous Silicon Heterojunction Photodetector" by Salahuddin (Year: 2013).*
"Graphite based Schottky diodes formed on Si, GaAs, and 4H-SiC substrates" by Tongay (Year: 2009).*
"Plasmon- and phonon-assisted recombinations in germanium" by Rasolt (Year: 1988).*

(Continued)

*Primary Examiner* — Evren Seven
(74) *Attorney, Agent, or Firm* — Marshall, Gerstein & Borun LLP

(57) ABSTRACT

A semiconductor optical device is comprised of a phonon donating material structurally connected to an indirect bandgap material to improve absorption and emission of light in the indirect bandgap material. An excitation energy source provides excitation radiation to the semiconductor optical device to excite electrons in the semiconductor optical device. Phonons from the phonon donating material present in the indirect bandgap material provide a mechanism for increased rates of electron-hole generation and recombination, and electrical leads provide an electrical connection to the semiconductor optical device.

20 Claims, 8 Drawing Sheets

(56) References Cited

OTHER PUBLICATIONS

"Temperature-dependent electronic charge transport characteristics at MoS2/p-type Ge heterojunctions" by Son (Year: 2018).*
"Phonon scattering processes in molybdenum disulfide" by Cao (Year: 2019).*
"Large area molybdenum disulphideepitaxial graphene vertical Van der Waals heterostructures" by Pierucci (Year: 2016).*
"Growth and electrical characterization of two-dimensional layered MoS2 /SiC heterojunctions" by Lee (Year: 2015).*
"Phonon-Assisted Auger Recombination in Germanium" bu Huldt (Year: 1976).*
"Recombination of donor bound-excitons in germanium" by Klingenstein (Year: 1979).*
Electrical and photovoltaic characteristics of MoS2/Si p-n junctions (Year: 2019).*
Bernardi et al., Extraordinary sunlight absorption and one nanometer thick photovoltaics using two-dimensional monolayer materials, Nano Lett., 2013, 13, 3664-70.
Chen et al., Helicity-resolved rama scattering of $MoS_2$, $MoSe_2$, $WS_2$, and $WSe_2$ atomic layers, Nano Letters, 2015, 15, 2526-32.
DOE Workshop on Silicon Photovoltaics, Jul. 29, 2015.
Li et al., Graphene-on-silicon schottky junction solar cells, Adv. Mater., 2010, 22:2743-8.
Plechinger et al., Raman spectroscopy of the interlayer shear mode in few-layer $MoS_2$ flakes, Appl. Phys. Lett., 101, 101906 (2012).
Tan et al., The shear mode of multilayer graphene, Nat. Mater., vol. 11, Apr. 2012, pp. 294-300.
Tsai et al., Monolayer MoS2 heterojunction solar cells, ACS Nano, 8(8):8317-22 (2014).
Tubino et al., Lattice dynamics and spectroscopic properties by a valence force potential of diamondlike crystals: C, Si, Ge, and Sn, J. Chem. Phys., 56, 1022 (1972).
Verble et al., "Rigid-layer lattice vibrations and van der waals bonding in hexagonal MoS2," Solid State Communications vol. 11, Iss. 8 941-944.
Zhao et al., Interlayer Breathing and Shear Modes in Few-Trilayer $MoS_2$ and $WSe_2$, Nano Lett. 2013, 13, 3, 1007-1015.

* cited by examiner

HYBRID PHONON-ENHANCED OPTICAL ABSORBERS AND EMITTERS

STATEMENT REGARDING FEDERALLY SPONSORED RESEARCH OR DEVELOPMENT

This invention was made with government support under Contract No. DE-AC02-06CH11357 awarded by the United States Department of Energy to UChicago Argonne, LLC, operator of Argonne National Laboratory. The government has certain rights in the invention.

FIELD OF THE DISCLOSURE

The present disclosure relates to semiconductor optical devices for absorption and emission of photons, and, in particular, increasing absorption and emission in indirect bandgap semiconductor materials.

BACKGROUND

Semiconductor materials are prominent in optical technologies such as in lasers, light emitting diodes (LEDs), photodetectors, and solar cells. Modern semiconductor fabrication methods allow for the doping of semiconductor materials which can allow for precise control of a device's electrical and optical properties. The versatility of the electrical and optical properties of semiconductor devices has established semiconductors as integral components in systems used in energy, communications, and defense, to name a few.

Certain semiconductor materials have emerged as frontrunners for specific applications. One such example is the use of silicon for photovoltaics (PV) or solar cells. As of 2017, silicon represented 95% of annual solar cell installations. Some properties that make silicon preferable for use in solar cells are its relatively high carrier mobility, its non-toxicity, and that it is readily available in silicon dioxide found in sand and quartz. Additionally, its bandgap energy, which determines the wavelength of light absorbed or emitted by the material, allows the material to absorb or emit light between 100 to 1100 nm which covers the majority of light in the solar spectrum.

The bandgap energy of a material determines the electromagnetic frequencies at which the material is optically active. FIGS. 1A and 1C are two examples of energy vs. crystal momentum diagrams for a given material. Crystal momentum is the allowable electron momentums in a given crystalline lattice. Energy and momentum conservation must be preserved for any electron/photon interaction in a material. In FIG. 1A an electron can make a transition from the valence energy band, $E_v$, into the conduction energy band, $E_c$, through absorbing a single photon with energy, $E_p$, equal to, or greater than, the bandgap energy, $E_v$, of the material. The electron can be excited by a single photon due to the fact that the maximum of the valence energy band and the minimum of the conduction energy band occur at the same crystal momentum, $k_g$, which is known as a direct bandgap. However, in FIG. 10, the maximum of the valence energy band does not occur at the same crystal momentum as the minimum of the conduction energy band, otherwise known as an indirect bandgap. Therefore, to preserve momentum during electron excitation, a phonon, or vibrational particle, must also be present to provide the extra momentum shift in the electron. Optical absorption and emission is typically inefficient in indirect bandgap materials due to the requirement of both a photon and a phonon for electron excitation or de-excitation.

While silicon exhibits many characteristics that make it preferable for use in solar cells, it has reduced optical absorption and emission efficiencies compared to other semiconductor materials due to its indirect bandgap which requires multi-particle interactions for radiative absorption or emission. Multi-particle interactions in silicon occur less frequently, thereby reducing the probability of absorbing or emitting a photon, which can reduce a device's electrical or optical output. One approach to increasing a device's output is to use more silicon, or a thicker silicon layer, increasing the probability of generating a phonon of the desired frequency. However, using more silicon creates bulky, heavy, and potentially expensive, devices. Thicker devices also require special mounting apparatus which may not fit a desired location. In addition, very thin flexible optical and electrical devices are becoming more and more desirable for portability, on-demand use, and in emerging technologies such as smart textiles. Recently, monolayer materials have been investigated for creating physically flexible solar cell devices. However, a major drawback of monolayer materials in solar cells is reduced efficiencies on the order of ~5%, which pale in comparison to many solar cell technologies on the market today with efficiencies of ~20% or higher.

Silicon is just one example of an indirect bandgap semiconductor material with desirable properties for optical devices. Other materials such as germanium, gallium phosphide, and even diamond are indirect bandgap materials that have desirable optical and electrical properties for various applications. Methods for increasing the optical absorption and emission efficiencies of indirect bandgap materials typically focus on improving fabrication techniques, defect management, and temperature control. More complex approaches to improving the efficiencies of indirect bandgap materials can cause increased fabrication and/or system complexity, and potentially increase the cost of such a technology.

SUMMARY OF THE DISCLOSURE

A semiconductor device includes an indirect bandgap material, a non-monolayer phonon donating material structurally connected to the indirect bandgap material and configured (i) to generate phonons, the phonons having a frequency that facilitates in the indirect bandgap material the absorption or emission of photons of a desired set of wavelengths and (ii) to deliver the phonons to the indirect bandgap material, and an electrical connection to the semiconductor device.

DETAILED DESCRIPTION

A semiconductor device in accordance with the present description generally features higher absorption and emission rates of photons than comparable technologies. The semiconductor device employs a phonon donating material to deliver phonons to an indirect bandgap material. The phonons allow for increased absorption and emission of photons in the indirect bandgap material.

The devices and methods described result in optical emitters and absorbers with increased efficiencies using known fabrication methods. The scalability of the devices is suitable, in embodiments, for use in lasers and LED technologies, as well as for generating photovoltaic panels and solar cells. The improved efficiency of the design described provides benefits for semiconductor technologies, including facilitating devices that are thinner, lighter, more portable, and/or mechanically flexible.

In electromagnetics, it is common to distinguish a frequency, wavelength, energy, and color of electromagnetic radiation. Each of these four characteristics is related to the other three. For example, the wavelength, in nanometers (nm), and frequency, in hertz (Hz), for a specified electromagnetic radiation are inversely proportional to each other. Similarly, the energy, in electron-volts (eV) or joules (J), of electromagnetic radiation is proportional to the frequency of that radiation. Therefore, for a given radiation at a given frequency, there is a corresponding wavelength and energy.

The fourth of the aforementioned characteristics, color, typically represents a group or band of frequencies or wavelengths. For example, the color blue is commonly defined as electromagnetic radiation with a wavelength from 450 nm to 495 nm. This wavelength band also corresponds to frequencies from 606 THz to 668 THz, and energies of 2.5 to 2.75 eV. The color blue, then, is any radiation with one of those wavelengths, or radiation with multiple wavelengths in that band. Therefore the term color may refer to one specific wavelength, or a band of wavelengths. Some areas of trade in electromagnetics prefer the use of one of the four terms over the others (e.g., color and wavelength are preferred when discussing optical filters, whereas frequency and energy are preferred when optical excitation processes). Therefore, the four terms may be understood to be freely interchangeable in the following discussion of electromagnetic radiation and optical semiconductor devices.

As would be understood by a person of ordinary skill in the art, semiconductor materials have conductivity values between the values of high conductivity metals and low conductivity insulators. Using mature fabrication technologies, different regions or parts of a semiconductor device can be doped to tune the electrical and optical properties of the semiconductor device. While there are many uses and interesting properties of semiconductors, optical absorption and emission will be discussed herein.

Figure 1A:
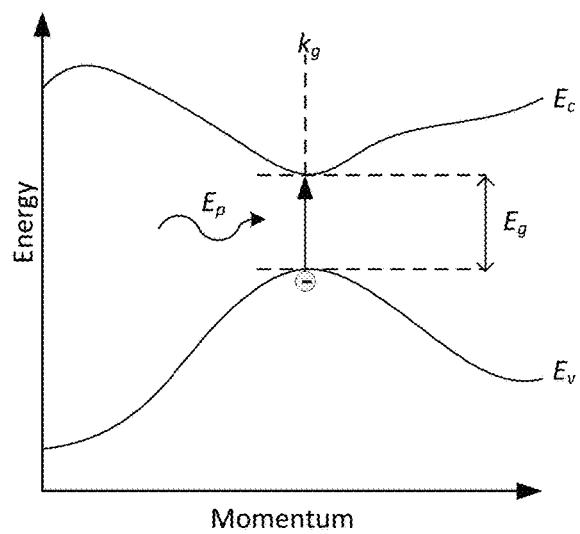
FIGS. 1A-C illustrate energy vs. crystal momentum diagrams in direct and indirect bandgap materials portraying the concepts of radiative absorption and recombination.
Figure 1B:
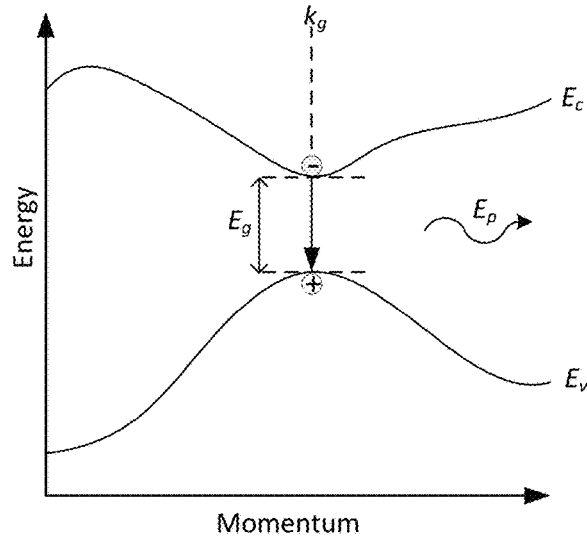

The efficiency and spectrum of optical absorption and emission of a semiconductor material depend heavily on the bandgap energy of the material, and more specifically, on the energy vs. crystal momentum curve of the semiconductor material. FIGS. 1A and 1B are two examples of potential energy vs. crystal momentum diagrams for a given material. The crystal momentum of a material is the allowable momenta of electrons in a crystalline lattice, which is related to the periodicity of the crystalline structure. The bandgap energy is the amount of energy required to excite an electron from the valence energy band, $E_v$, into the conduction band, $E_c$. As an electron is excited into the conduction band it leaves behind a positively charged hole. Therefore, electron excitation in semiconductors is often referred to as electron-hole pair generation. Once in the conduction band, the electron can be separated spatially from the hole with an electric field, or it can recombine with any positive holes radiatively or non-radiatively. Radiative recombination occurs when an electron in the conduction band recombines with a hole in the valence band and emits a photon. The energy difference of the electron in the conduction band and the electron in the valence band determines the energy of the emitted photon and, thereby, the photon's frequency. Non-radiative recombination occurs when an electron recombines with a hole with the release of energy in the form of a phonon. Therefore, non-radiative recombination does not release electromagnetic radiation, but instead releases heat or vibrational energy. Non-radiative recombination reduces the efficiency of optical processes in a device and therefore is often undesirable in semiconductor optical device.

Conservation of both energy and momentum is required for electron-hole pair generation, and for recombination. In FIG. 1A, for example, an electron in the valence band, $E_v$, can be excited into the conduction band, $E_c$, by a photon with energy, $E_p$, equal to or greater than the bandgap energy, $E_g$. The energy of the photon is absorbed by the electron and therefore the total system energy, before and after the excitation, is conserved. A single photon may induce the excitation illustrated in FIG. 1A due to the fact that the maximum of the valence energy band and the minimum of the conduction energy band occur at the same crystal momentum, $k_g$. FIG. 1B illustrates a scenario where an electron in the conduction band may recombine with a positive hole in the valence band and radioactively emit a photon with energy $E_p$. As in the excitation illustrated in FIG. 1A, the total system energy before and after the recombination is conserved. The momentum is also conserved in FIG. 1B due to the alignment of the extrema of the conduction and valence energy bands at a same momentum value.

The bandgaps illustrated in FIGS. 1A and 1B are called direct bandgaps. Direct bandgaps require only a single particle or, as illustrated, photon for electron-hole generation and electron-hole recombination. Therefore, direct bandgap materials usually exhibit high photon absorption and emission efficiencies. Some examples of direct bandgap materials include indium arsenide, which is commonly used in infrared detectors, and gallium nitride which has been implemented in high efficiency blue LEDs. Fast recombination rates of electrons and holes often cause electron-hole pairs to recombine before electrons are able to reach electrical terminals or leads of a semiconductor device, making direct bandgap materials undesirable for use in solar cell technologies.

Figure 1C:
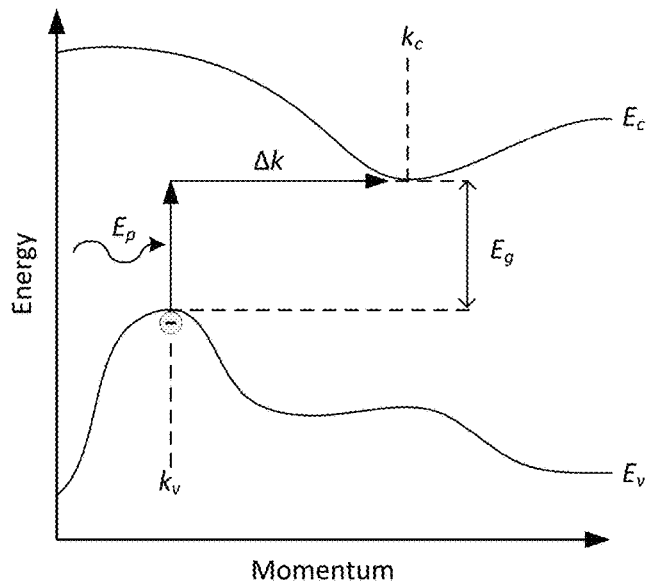

FIG. 1C shows an energy vs. crystal momentum diagram for an indirect bandgap material. As with the direct bandgap, the bandgap energy, $E_g$, for an indirect bandgap material is the difference between the maximum valence band energy and the minimum conduction band energy. The difference being that in an indirect bandgap material the extrema of the valence band and conduction band occur at different, non-equal crystal momenta. It is evident from FIG. 10 that a single photon with energy, $E_p$, equal to the bandgap energy, $E_g$, is not sufficient for the generation or recombination of an electron-hole pair in an indirect bandgap material because momentum is not conserved. The system energy is conserved during an excitation event as the conduction band energy is equal to that of the photon energy added to that of the electron valence band energy. However, momentum is not conserved during a single photon excitation in an indirect bandgap material because there is a difference, $\Delta k$, between the electron valence band momentum, $k_v$, and the electron conduction band momentum, $k_c$. Similarly, any electron-hole pair recombination requires a momentum shift of $-\Delta k$ in the indirect bandgap material of FIG. 1C. Crystallographic phonons with certain frequencies may provide the momentum shift required for optical electron-hole interactions in indirect bandgap materials.

Figure 2:
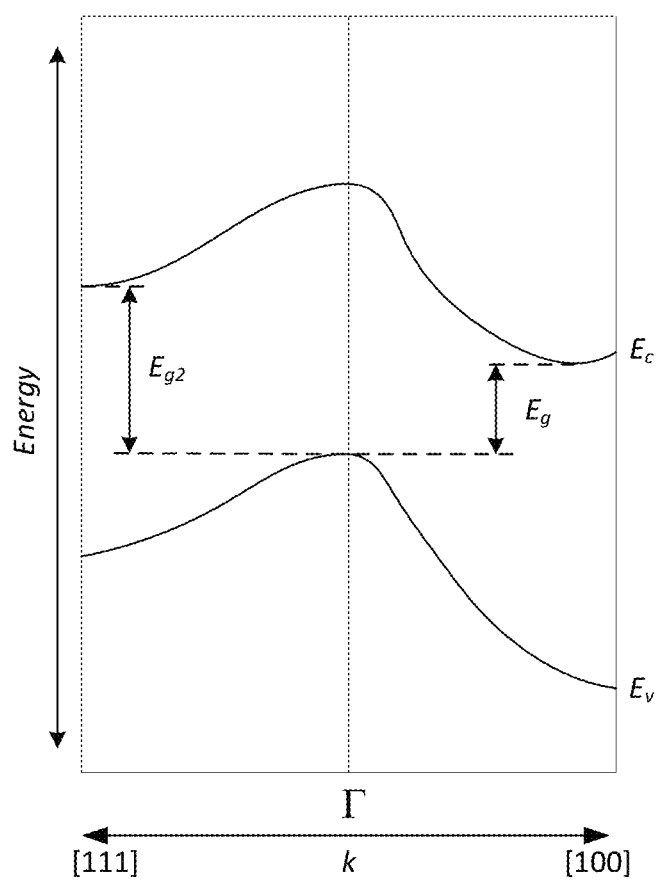
FIG. 2 is a plot of the indirect bandgap energy vs. crystal momentum diagram for silicon.
Figure 3:
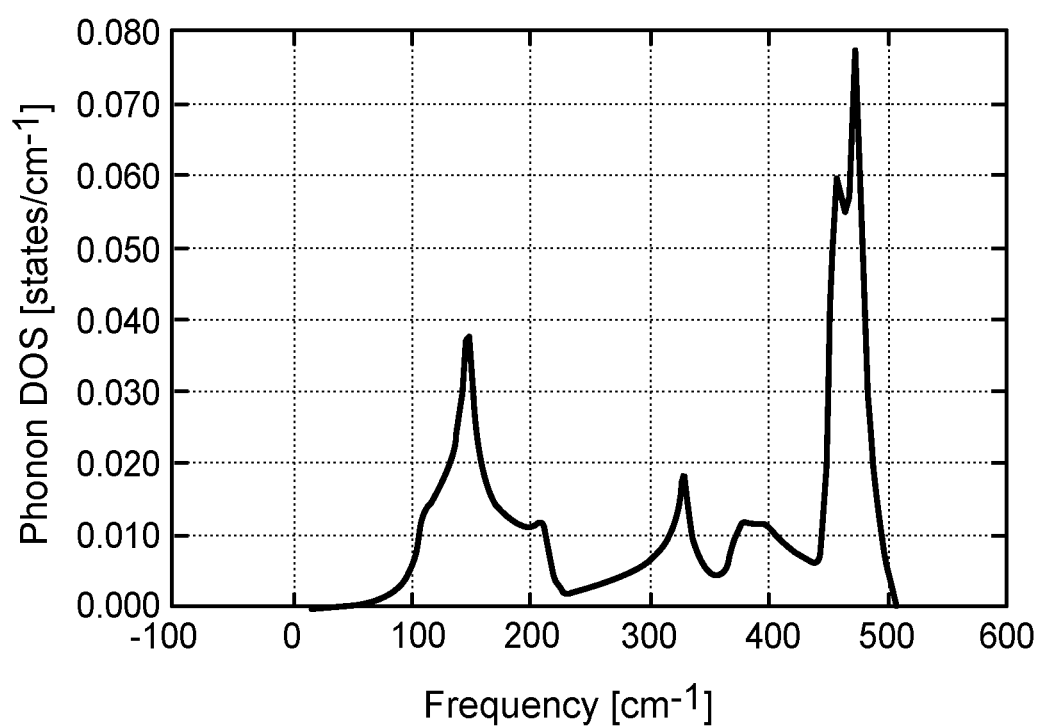
FIG. 3 is a plot of the phonon density of states spectrum generated intrinsically in bulk silicon.

Phonons, or lattice vibrations, of specific frequencies are desired to facilitate electron-hole generation and recombination in indirect bandgap materials. FIG. 2 is an energy vs. crystal momentum diagram for silicon. It is evident from FIG. 2 that silicon is an indirect bandgap material. In silicon, the momentum wavenumber mismatch of the indirect bandgap is 50 $cm^{-1}$, therefore phonons with a wavenumber in the region of 50 $cm^{-1}$ are desired to facilitate electron-hole generation and recombination. FIG. 3A is the phonon density of states (DOS) wavenumber spectrum for silicon which shows very little phonon generation below 100 $cm^{-1}$. Due to silicon's low probability of generating phonons with wavenumbers near 50 $cm^{-1}$, bulk silicon is required to fabricate functional optically active devices. For phonon enhanced absorption and/or emission in silicon, a high DOS of phonon donors must exist near the required phonon frequency of 50 $cm^{-1}$. In non-monolayer or bulk transition metal dichalcogenides, both shear and breathing mode phonon vibrations with wavenumbers less than 50 $cm^{-1}$ are generated. In $MoS_2$ phonons with wavenumbers near 30 $cm^{-1}$ are generated, whereas phonons with wavenumbers less than 50 $cm^{-1}$ are not readily generated in silicon.

As should be understood, the required phonon frequency of 50 $cm^{-1}$ for silicon is only one of a band of phonon frequencies that may facilitate enhanced absorption or emission in silicon. In fact, phonons with frequencies ranging from 0 to 53 $cm^{-1}$ may facilitate enhanced absorption and/or emission in silicon. In addition, it should also be understood that photons with energies greater than the bandgap energy of a material may also be absorbed or emitted by the radiation emitting material, as governed by the energy and wavenumber band structures for a given material (i.e., by abiding by the laws of energy and momentum conservation).

In addition, an indirect bandgap material may have multiple local minima in the conduction energy band, and multiple local maxima in the valence energy band. As such, multiple frequency bands of phonons and photons may enable specific transitions between local valence band maxima and local conduction band minima. For example, referring again to FIG. 2 with respect to silicon, the absolute minima of the conduction band is illustrated in the [100] direction of the structure, and defines the bandgap energy $E_g$. Moving towards the [111] direction, a second, local minima in the conduction band also exists, with a higher energy gap, $E_{g2}$, that requires higher minimum energy photons for radiative absorption and emission. Therefore, a first band of phonon and photon frequencies may enhance absorption and emission to and from the absolute minima with energy $E_g$, while a second band of phonon and photon frequencies may enhance the absorption and emission to and from the second, local minima with energy $E_{g2}$. The second set of photon and phonon frequencies may be a subset, superset, have some overlap, or be completely different than the first set of photon and phonon frequencies. It should therefore be understood that various bands of photon frequencies, and phonon frequencies may be utilized in embodiments to enhance the absorption and emission of radiation depending on the desired frequencies of the absorbed and emitted radiation, and the energy band structure of the material.

Figure 4:
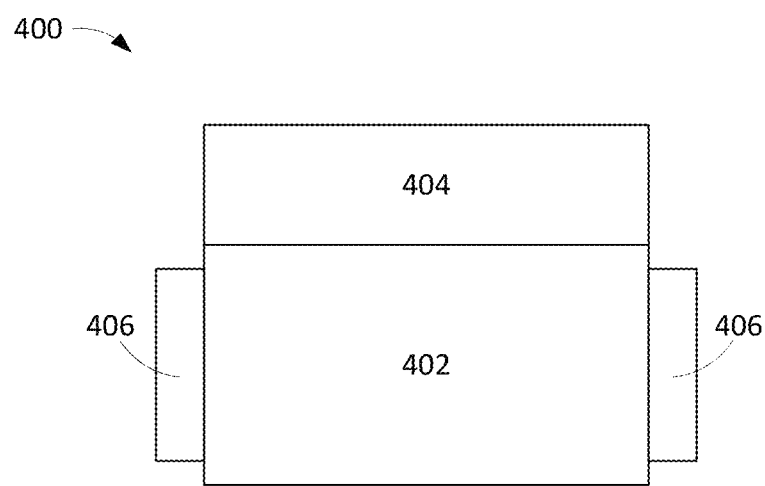
FIG. 4 depicts an embodiment of a phonon enhanced optical absorber or emitter having a phonon donating material, indirect bandgap material, and electrical connections.

FIG. 4 depicts an embodiment of a semiconductor optical device 400 having improved emission and absorption characteristics in accordance with the present description. The device 400 includes a phonon donating material 404 structurally connected to an indirect bandgap material 402 material. The direct growth or deposition of the phonon donating material 404 on the indirect bandgap material 402, or the direct growth or deposition of the indirect bandgap material 402 on the phonon donating material 404, allows for phonons generated in the phonon donating material 404 to propagate to the indirect bandgap material 402, which may increase the efficiency of electron-hole generation and recombination in the indirect bandgap material 402, and therefore, photon absorption and emission by bridging the indirect bandgap through preserving momentum in the crystalline material. Electrical connections 406 allow for a current and/or voltage to be applied to or extracted from the optical semiconductor device 400. The indirect bandgap material 402 may be silicon, germanium silicon carbide, diamond, tin, selenium, gallium phosphide, boron nitride, or any other indirect bandgap material.

A prominent consideration when choosing an indirect bandgap material for a semiconductor optical device is the optical region of interest, which determines the desired optically active region of the indirect bandgap material. The optically active region of a material is the set of wavelengths or frequencies a material absorbs and/or emits. In embodiments, the desired set of wavelengths may be 100 nm or longer, 500 nm or longer, 1 micron or longer, 1.5 microns or longer, 2 microns or longer, 2 microns or less, 1.3 microns or less, 800 nm or less, 400 nm or less, from 100 nm to 2 microns, from 300 to 1700 nm, from 500 to 1500 nm, from 700 to 1300 nm, from 900 to 1100 nm, from 1800 nm to 2 microns, from 1500 to 2 microns, from 1300 to 2 microns, from 1 micron to 2 microns, from 700 nm to 2 microns from 400 nm to 2 microns, from 200 nm to 2 microns, from 380 to 750 nm, from 500 nm to 900 nm, from 100 to 1300 nm, from 900 to 1400 nm, from 1260 to 1625 nm, from 1500 to 1700 nm, from 1000 to 1800 nm, longer than 1800 nm, from 1500 nm to 2 microns, or any other potential wavelength or wavelength band of interest. Silicon will often be considered in embodiments herein due to its desirable optically active region (which overlaps significantly with the solar spectrum), and its current technological and market domination in many optical semiconductor devices as described herein. Though described herein with respect to silicon, this is not meant to be limiting but is done for simplicity and clarity of embodiments of devices.

In embodiments, the indirect bandgap material may be any lengths or widths that current or future fabrication technologies may allow. In addition, the thickness of the indirect bandgap material may be a single monolayer, 1 to 10 nanometers, 10 nanometers to 1 micron, 1 micron to 1 millimeter, greater than 1 millimeter, less than 10 millimeters, less than 5 millimeters, less than 1 millimeter, less than 500 microns, less than 100 microns, less than 50 microns, less than 10 microns, from 1 to 100 microns, from 20 to 100 microns from 25 to 100 microns, from 50 to 100 microns, from 100 microns to 1 millimeter, from 500 microns to 1 millimeter, from 1 millimeter to 10 millimeters, from 1 millimeter to 100 millimeters, or any other desired thickness. The thickness of the indirect bandgap material may depend on factors such as mounting or device positioning constraints, required device efficiency, required physical flexibility, cost of materials, or other factors. For example, for a given length and width, the efficiency of optical emission and/or absorption of a semiconductor optical device increases with increased thickness. Conversely, increased thickness may also prevent a material from being physically bendable or flexible and render it useless for certain applications, or may raise the cost of the semiconductor optical device to render it non-marketable.

In embodiments that are physically bendable or flexible, the semiconductor optical device may be bent or folded for transport, or the device may be physically manipulated to contour along a desired surface while maintaining optical and electrical functionality. For example, in space applications solar panels may need to be folded or rolled up to be launched into orbit. Once in orbit, the panels may then be unrolled to increase the surface area of the solar panel exposed to solar radiation. Other potential applications of flexible solar panel technologies may require the solar panel to bend along the contour of a curved surface such as along a rounded roof of a house, along an outer curved surface of a car or vehicle, or along the contour of a hat or piece of clothing for a portable energy source, among many others. Applications that require the rolling, bending, or folding of solar panels may benefit from the potential to create thinner physically flexible solar panels as described herein.

Referring now back to FIG. 4, the phonon donating material 404 may be molybdenum disulfide, tungsten diselenide, tungsten disulfide, hexagonal boron nitride, molybdenum diselenide, titanium disulfide, niobium diselenide, any other transition metal dichalcogenide, graphene, or any material able to generate and donate phonons to an indirect bandgap material. The crystallographic composition of some materials, including transition metal dichalcogenides, allows for phonons with low wavenumbers to be generated in the material, which is often desirable for increasing electron-hole pair interactions in indirect bandgap materials as presented herein. One specific crystal structure that generates low frequency phonons is the $MX_2$ structure, with M being a transition metal such as tungsten or molybdenum, and X being a chalcogenide such as sulfur or selenium. The $MX_2$ structure results in hexagonal crystal unit cells, which support the phonon vibrational modes and wavenumbers required for the technologies described herein. The phonon donating material 104 may also be graphite which has a hexagonal structure similar to that of the transition metal dichalcogenides. In practice, the phonon donating material may be any material with a hexagonal crystal unit cell, or any material that is able to generate phonons with a wavenumber required for momentum conservation of electron-hole pair generation and recombination in a corresponding indirect bandgap material.

In general, a single layer of a material is known as a monolayer material. It is desirable to have more than a single layer, referred to herein as a non-monolayer, of the phonon donating material. While monolayer materials consist of a single layer of a substance or material, non-monolayer materials consist of more than a single layer of a substance or material and, therefore, exhibit both interlayer and intralayer lattice vibrations allowing for both shear (intralayer) and breathing (interlayer) phonon modes. Also, including more layers of a phonon donating material allows for the potential generation of more phonons in the material. Monolayer phonon materials only exhibit intralayer lattice vibrations due to the fact that only a single layer exists. The generation of only shear phonon modes reduces the potential for phonon generation and the spectrum of phonon frequencies in a given material. In addition, in some phonon donating materials, the supported phonon mode frequencies may be tuned by the number of layers of the phonon donating material. In embodiments, the thickness of the phonon donating material may be two or more molecular or atomic layers, 1 to 10 nanometers, 10 nanometers to 1 micron, 1 micron to 1 millimeter, greater than 1 millimeter, less than 10 millimeters, less than 5 millimeters, less than 1 millimeter, less than 500 microns, less than 100 microns, less than 50 microns, less than 10 microns, from 1 to 100 microns, from 20 to 100 microns from 25 to 100 microns, from 50 to 100 microns, from 100 microns to 1 millimeter, from 500 microns to 1 millimeter, from 1 millimeter to 10 millimeters, from 1 millimeter to 100 millimeters, or any other desired thickness adequate for generating and donating phonons to an indirect bandgap materials.

In addition to the vibrational characteristics of the phonon donating material 404, the crystal lattice constants of the phonon donating material 404 and the indirect bandgap material 402 must also be taken into consideration. In embodiments where silicon comprises the indirect bandgap material 402 one must take into account the lattice constant of both silicon and a potential phonon donating material 404. If the lattice mismatch between the silicon and a potential phonon donating material 404 is significant, defects are introduced into the lattices of the device. Defects in the semiconductor device 400 can cause undesirable changes to the electrical, magnetic, and/or optical properties of the materials. Many indirect bandgap materials are compatible with transition metal dichalcogenides, among other potential phonon donor materials, when considering fabrication and lattice mismatch.

Due to both the indirect bandgap material 402 and the phonon donating material 404 being semiconductor materials they may be fabricated using the same or similar methods. Semiconductor fabrication methods such as metal organic chemical vapor deposition, molecular beam epitaxy, atomic layer deposition, chemical vapor deposition, or any other suitable method may be used to fabricate the indirect bandgap material 402 and/or the phonon donating material 404. By fabricating the two materials in the same or similar methods, the phonon donating material 404 can be directly deposited on, grown on, or structurally connected to the indirect bandgap material 402. One skilled in the art would recognize that the processes of growing or depositing materials for semiconductor fabrication are dependent on the particular method of fabrication and can be used interchangeably when discussing generic semiconductor fabrication methods.

Figure 5A:
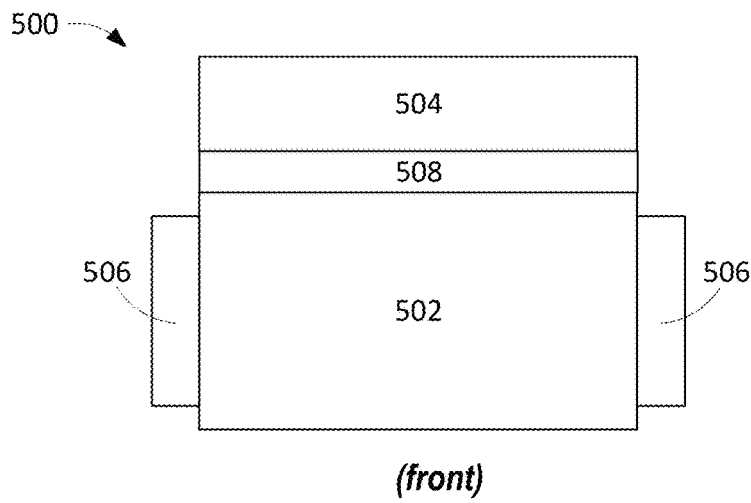
FIG. 5A depicts an embodiment of a phonon enhanced optical absorber or emitter in which a phonon guiding medium is between a phonon donating material and an indirect bandgap material.
Figure 5A:
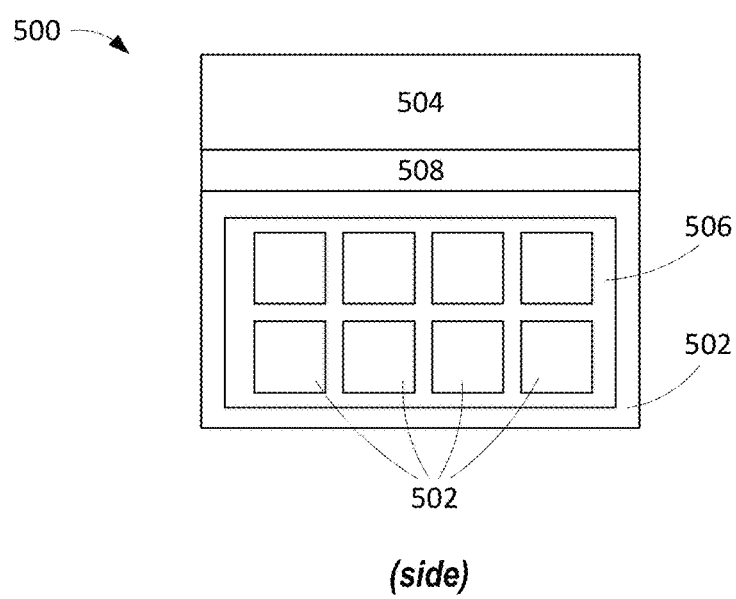
Figure 5B:
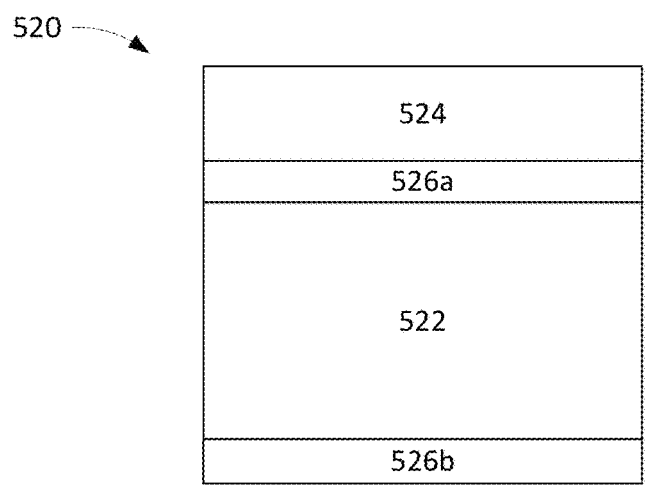
FIG. 5B depicts an embodiment of a phonon enhanced optical absorber or emitter in which an electrical lead is between a phonon guiding material and an indirect bandgap material.

In embodiments, the phonon donating material 404 may generate phonons isotropically, or in a guided manner. In an embodiment 500 depicted in FIG. 5, an intermediate material 508 is placed between a phonon donating material 504 and an indirect bandgap material 502. The intermediate material 508 may facilitate the transport of phonons from the phonon donating material 504 to the indirect bandgap material 502, acting as a phonon guide. Although the intermediate material is illustrated as a single block in FIG. 5, the intermediate material 508 may be a single material, or may be a stack of multiple materials. The intermediate material 508 may have a lattice constant that reduces the lattice strain or mismatch between the phonon donating material 504 and the indirect bandgap material 502. For example, in an embodiment with silicon as the indirect bandgap material 502, which has a lattice constant of 5.43 Å, and molybdenum disulfide as the phonon donating material 504, which has a lattice constant of 3.16 Å, a single or multilayer intermediate material 506 with a lattice constant between 5.43 and 3.16 Å may reduce strain at the interfaces of the materials. Materials such as silicon carbide, boron nitride, or any other material with a lattice constant between 5.43 and 3.16 Å may comprise the intermediate interface in such an embodiment. While silicon and molybdenum disulfide are used as example materials for the described embodiment, any indirect bandgap materials and phonon donating materials may be used, which could change the desired range of lattice constants of the intermediate material. In addition, in embodiments with a stack of multiple materials as the intermediate material 508, the lattice constants of the different materials employed as the intermediate material 508 may vary across the stack in a manner that creates a gradient of lattice constants ranging from the lattice constant of the phonon donating material 504 to the lattice constant of the indirect bandgap material 502. While the phonon donating material 404 of FIG. 4 is directly coupled to the indirect bandgap material 402 in FIG. 4, the embodiment of FIG. 5 is one example of an indirect structural connection between the phonon donating material 504 and the indirect bandgap material through an intermediate material 508.

Referring now back to FIG. 4, electrical leads 406 connected to the semiconductor device 400 provide electrical connectivity to the semiconductor device 400. In embodiments, the electrical leads may provide a current and/or voltage to the semiconductor device. In other embodiments, the electrical leads 406 may collect a current from the semiconductor device. In yet other embodiments, the electrical leads 408 may both provide a current and/or voltage to, and collect a current from the semiconductor device 400. In embodiments the electrical leads 406 may be metallic, doped or undoped semiconductor materials, metalorganics, conductive polymers, a non-magnetic transition metal, or any other material able to provide an electrical connection to the semiconductor device. In embodiments the electrical leads 406 may be configured as entire panels covering multiple surfaces or facets of the semiconductor device. In other embodiments, such as the embodiment 500 of FIG. 5, the electrical leads 506 may be configured as grid patterns on surfaces or facets of the semiconductor device. In some embodiments the electrical leads may be combinations of panels and grid patterns covering multiple surfaces or facets of the semiconductor device. In some embodiments, such as the embodiment 520 of FIG. 5B, an electrical lead 526a may be positioned along at least a portion of an interface between a phonon donating material 524 and an indirect bandgap material 522, and an opposing electrical lead 526b may be positioned along an opposite surface of the indirect bandgap material 522. In embodiments the electrical leads may be any combination of the described configurations or any other configuration able to provide an electrical connect to the semiconductor device.

Figure 6:
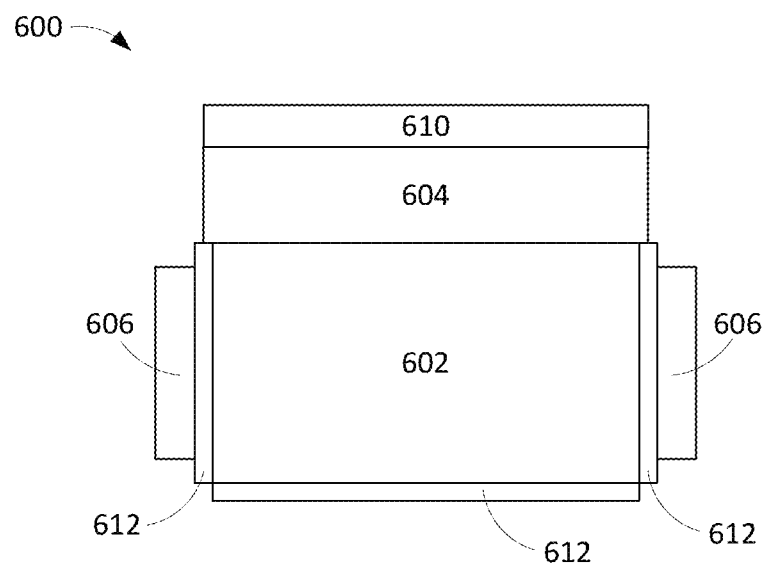
FIG. 6 depicts an embodiment of a phonon enhanced optical absorber or emitter in which an antireflective measure, and mirrors are present to increase the efficiency of the device.

FIG. 6 illustrates an embodiment of a semiconductor optical device 600 with an indirect bandgap material 602, a phonon donating material 604, electrical leads 606, and an antireflection measure 610. An embodiment with an antireflection measure, such as that in the device 600, may increase the amount of light absorbed by the device, and more specifically absorbed by the indirect bandgap material. The antireflection measure 610 may be an antireflective coating such as a thin film coating, a graded-index coating, a magnesium fluoride coating, single- or multi-layer interference coatings, or any other coating capable of increasing the amount of light coupled into the semiconductor optical device. The antireflection measure 610 may also be comprised of a patterned surface such as a sub-wavelength moth eye pattern designed to reduce reflections of desired wavelengths. Moth eye anti-reflective patterns are typically sub-micron structures and can be as small as nanometer photonic crystal structures, as long as the structures are smaller than the wavelengths of interest. The moth eye structures create a graded index region between two mediums which reduces the amount of reflected light at the boundary of the two mediums. The embodiment 600 may also employ mirrors or reflective surfaces 612 configured to prevent light in the device 600 from being transmitted through the reflective surfaces 612 and therefore reducing the light transmitting through the device 600. Reflecting light back into the device 600 increases the opportunities for light absorption which may increase device efficiency.

The embodiment of FIG. 6 may be used as a preferred embodiment for implementation in optical absorption devices such as solar cells. The increased efficiency of the phonon assisted absorption in the indirect bandgap semiconductor material 602 is complimented by an antireflection measure 610 and reflective surfaces 612 intended to allow light into the semiconductor device 600 and to prevent the light from escaping out of the reflective surfaces 612. In semiconductor devices implemented as solar cells, such as the embodiment of FIG. 6, the indirect bandgap material 602 may be silicon, germanium, silicon carbide, or any other material with an absorption band corresponding to the optical frequencies of interest. The embodiment 600 of FIG. 6 may be preferred for solar cells in space or on Earth. Due to increased absorption, the embodiment 600 of FIG. 6 may be used to generate smaller solar cells which could be worn or implemented on a hat to charge an external battery, or plug directly into a portable device such as a cell phone. In addition, arrays of the embodiment 600 of FIG. 6 may be connected in series or parallel to provide a desired voltage or current from the device.

Figure 7:
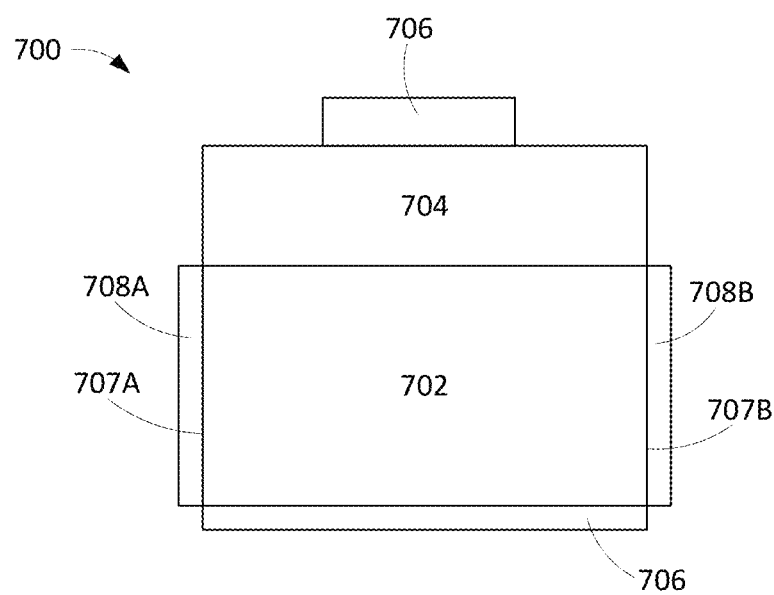
FIG. 7 depicts an embodiment of a phonon enhanced optical absorber or emitter with reflective mirrors which can be configured as a laser device.

FIG. 7 illustrates an embodiment of an optical device 700 that is comprised of a phonon donating material 704 coupled to an indirect bandgap material 702 configured to provide phonons to the indirect bandgap material 702. Electrical leads 706 provide a current to, or electrically pump, the indirect bandgap material 702. Excited electrons in the indirect bandgap material 702 may then undergo radiative recombination due to the phonon enhanced emission as illustrated in FIG. 10. Emitted photons may then induce other electron-hole pair recombination in the optical device 700. First and second mirrors 708A and 708B on corresponding first and second side facets 707A and 707B of the indirect bandgap material 702 may be implemented to create an optical cavity. In embodiments, the first mirror 708A may be a 100% reflective mirror while the second mirror 708B has some reflectivity less than 100% to allow some optical radiation to escape the device through the second facet 707B. Embodiments such as the embodiment of FIG. 7 may be preferred for generating lasing optical devices. In a preferred embodiment, the side facets 707A and 707B have no reflective properties and no cavity is created in the optical device 700, which may be an implementation of a light emitting diode. In embodiments of semiconductor optical devices intended for emission, such as the embodiment of FIG. 7, the indirect bandgap material may be silicon carbide, gallium phosphide, boron nitride, or any other material with an emission spectrum of interest.

The embodiment 700 of FIG. 7. May be preferable for implementation in displays. The increased emission efficiency makes such a display more energy efficient which can reduce energy waste or increase battery lifetimes for portable displays. Lasers and, more specifically, portable lasers, such as laser pointers, implementing phonon enhanced emission of an indirect bandgap material may exhibit longer battery lifetimes as well.

While the indirect bandgap material, in various embodiments, is described as the light emitting material, the phonon donating material may emit light as well. In such embodiments, the desired emission spectra of the indirect bandgap material and the supplemental emission spectra of the phonon donating material may overlap entirely, have some overlap, or be entirely different spectra. Overlapping of the two spectra partially or entirely may increase the emission efficiency for a given set of optical frequencies, while two entirely different spectra may broaden the band or bands of optical frequencies emitted by the device.

Figure 8A:
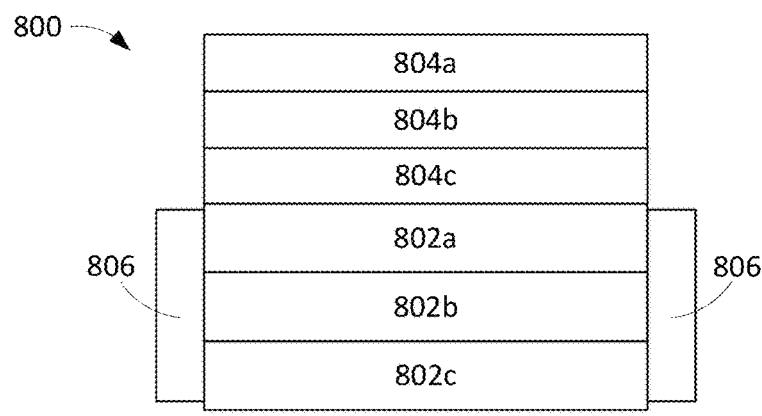
FIGS. 8A-C depict embodiments of phonon enhanced optical absorbers or emitters with multiple layers of indirect bandgap materials and/or phonon donating materials.
Figure 8B:
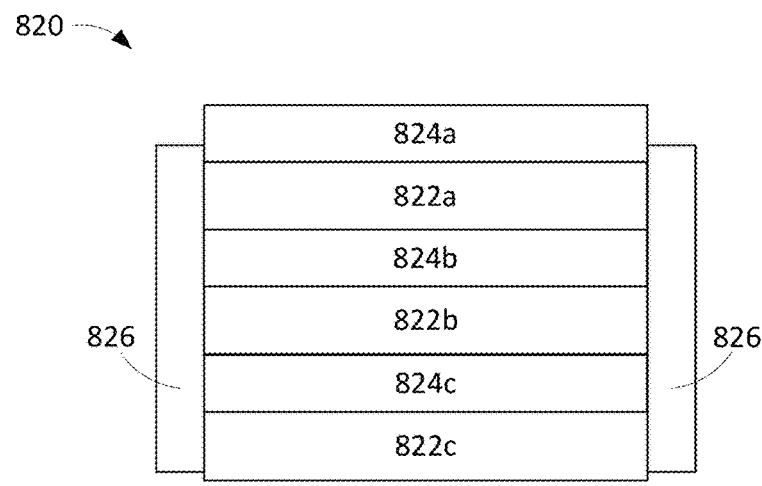
Figure 8C:
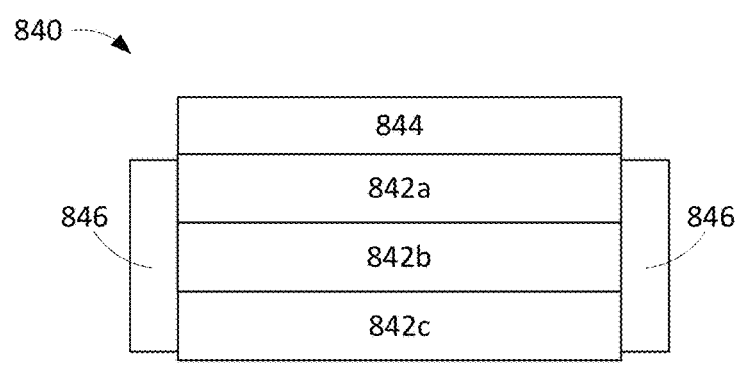

In embodiments, such as the embodiment of FIG. 8A, the indirect bandgap material may be made of multiple layers of indirect bandgap materials 802*a-c*. Similarly, the phonon donating material may be made of multiple layers of phonon donating materials 804*a-c*. Electrical leads 806 provide an electrical connection to the indirect bandgap material. In preferred embodiments, such as the embodiment of an optical semiconductor device of FIG. 8B, the layers of indirect bandgap materials 822*a-c* are interleaved with layers of phonon donating materials 824*a-c*. Such embodiments may provide the ability to structurally connect each indirect bandgap material layer with a phonon donating layer that provides phonons of desired frequencies for the specific indirect bandgap material. In other embodiments, such as the embodiment 840 of FIG. 8C, an indirect bandgap material may be made of multiple layers of indirect bandgap materials 842*a-c*, and a phonon donating material 844 may be made of a single phonon donating material. In embodiments with multiple indirect bandgap materials 802*a-c*, phonons from the single phonon donating material 844 may pass through multiple layers of indirect bandgap materials 842*a-c* providing phonon assisted absorption in each layer of indirect bandgap material 842*a-c*. In preferred embodiments of absorbing semiconductor optical devices with multiple layers of indirect bandgap materials, such as the embodiments illustrated in FIGS. 8A-8C, the top indirect bandgap layers 802*a*, 822*a*, and 842*a* have the widest bandgaps, with lower indirect bandgap materials 802*c*, 802*c*, 822*b*, 822*c*, 842*b* and 842*c* having narrower bandgaps to ensure the highest efficiency of the semiconductor optical devices 800, 820, and 840 of FIGS. 8A-8C.

In any embodiment 800, 820, and 840 that employs multiple layers of indirect bandgap materials 802*a-c*, 822*a-c*, and 842*a-c* the indirect bandgap layers 802*a-c*, 822*a-c*, and 842*a-c* may be the same material, may alternate between two materials, may cycle through three or more materials, and/or may be completely different materials in each indirect bandgap material layer 802*a-c*, 822*a-c* and 842*a-c*. Similarly, in embodiments 800 and 820 that employ multiple phonon donating material layers 804*a-c* and 824*a-c*, the layers 804*a-c* and 824*a-c* may be the same material, may alternate between two phonon donating materials, may cycle through three or more phonon donating materials, and/or each layer 804*a-c* and 822*a-c* may be a different phonon donating material. Alternative multilayer embodiments may employ a single indirect bandgap material with multiple phonon donating material layers, multiple non-interlaced or alternating layers of indirect bandgap materials and phonon donating materials, and/or number of and/or configuration of multiple indirect bandgap and/or phonon donating material layers.

In any multiple layer embodiment of an optical device, such as the devices 700, 800, 820, and 840 of FIGS. 7 and 8A-C respectively, the device can be configured to emit or absorb light based on the materials comprising the device and the electrical connection provided by electrical leads. In addition, a specific device may be further optimized for emission or absorption based on reflective and anti-reflective measures, and is not necessary dependent on being multi or single-layer.

While the indirect bandgap material 402 (FIG. 4), 502 (FIG. 5A), 602 (FIG. 6), 702 (FIG. 7), 802*a-c* (FIG. 8A), 822*a-c* (FIG. 8B), and 842*a-c* (FIG. 8C) in various embodiments is described as the light absorbing material, the phonon donating material may absorb a supplemental band of light as well. In such embodiments, the desired absorption spectra of the indirect bandgap material and the supplemental absorption band of the phonon donating material may overlap entirely, have some overlap, or be entirely different spectra. Overlapping of the two spectra partially or entirely may increase the absorption efficiency for a given set of optical frequencies, while two entirely different spectra may broaden the band or bands of optical frequencies absorbed by the device. Embodiments that employ multiple layers of indirect bandgap materials for absorption, or that employ an absorptive phonon donating material, may be implemented in multi-junction or tandem solar cells. Tandem solar cells typically absorb broader bands of optical frequencies and can have increased absorption efficiencies due to the multi-layered absorptive materials.

Semiconductor optical devices that employ phonon donating materials to improve the efficiency of optical absorption and emission in indirect bandgap materials can improve the efficiency of optical devices. Increasing the thickness or amount of phonon donating material in a device may increase the number of phonons reaching the indirect bandgap material which increases the efficiency of the device. Increasing the amount of indirect bandgap material in a device also increases the efficiency of optical emission and absorption of a device. The addition of a phonon donating material to enhance optical absorption and/or emission in an indirect bandgap material allows for less of the indirect bandgap material for the same optical efficiency. Using phonon assisted optical absorption and emission, thinner devices can be fabricated with efficiencies equal to or similar to the efficiencies of thicker, heavier, more costly devices. Thinner devices can be used for implementations in physically flexible optical devices. In addition, if thinner devices are not required or desired, bulkier optical technologies can be created with increased efficiency due to phonon assisted absorption and emission.

The following list of aspects reflects a variety of the embodiments explicitly contemplated by the present application. Those of ordinary skill in the art will readily appreciate that the aspects below are neither limiting of the embodiments disclosed herein, nor exhaustive of all of the embodiments conceivable from the disclosure above, but are instead meant to be exemplary in nature.

1. A semiconductor device comprising: an indirect bandgap material; a non-monolayer phonon donating material structurally connected to the indirect bandgap material and configured (i) to generate phonons, the phonons having a frequency that facilitates in the indirect bandgap material the absorption or emission of photons of a desired set of wavelengths and (ii) to deliver the phonons to the indirect bandgap material; and an electrical connection to the semiconductor device.

2. A semiconductor device according to aspect 1, wherein the indirect bandgap material is from 1 to 10 nanometers thick.

3. A semiconductor device according to aspect 1, wherein the indirect bandgap material is from 10 nanometers to 1 micron thick.

4. A semiconductor device according to aspect 1, wherein the indirect bandgap material is from 1 micron to 1 millimeter thick.

5. A semiconductor device according to aspect 1, wherein the indirect bandgap material is greater than 1 millimeter thick.

6. A semiconductor device according to aspect 1, wherein the indirect bandgap material is less than 10 millimeters thick.

7. A semiconductor device according to aspect 1, wherein the indirect bandgap material is less than less than 5 millimeters thick.

8. A semiconductor device according to aspect 1, wherein the indirect bandgap material is less than 1 millimeter thick.

9. A semiconductor device according to aspect 1, wherein the indirect bandgap material is less than 500 microns thick.

10. A semiconductor device according to aspect 1, wherein the indirect bandgap material is less than 100 microns thick.

11. A semiconductor device according to aspect 1, wherein the indirect bandgap material is less than 50 microns thick.

12. A semiconductor device according to aspect 1, wherein the indirect bandgap material is less than 10 microns thick.

13. A semiconductor device according to aspect 1, wherein the indirect bandgap material is from 1 to 100 microns thick.

14. A semiconductor device according to aspect 1, wherein the indirect bandgap material is from 20 to 100 microns thick.

15. A semiconductor device according to aspect 1, wherein the indirect bandgap material is from 25 to 100 microns thick.

16. A semiconductor device according to aspect 1, wherein the indirect bandgap material is from 50 to 100 microns thick.

17. A semiconductor device according to aspect 1, wherein the indirect bandgap material is from 100 microns to 1 millimeter thick.

18. A semiconductor device according to aspect 1, wherein the indirect bandgap material is from 500 microns to 1 millimeter thick.

19. A semiconductor device according to aspect 1, wherein the indirect bandgap material is from 1 millimeter to 10 millimeters thick.

20. A semiconductor device according to aspect 1, wherein the indirect bandgap material is from 1 millimeter to 100 millimeters thick.

21. A semiconductor device according to any one of aspects 1 to 20, wherein the thickness of the semiconductor device is such that the semiconductor device is flexible or bendable.

22. A semiconductor device according to any one of aspects 1 to 21, wherein the desired set of wavelengths is between 380 and 750 nanometers.

23. A semiconductor device according to any one of aspects 1 to 21, wherein the desired set of wavelengths is between 100 and 1300 nanometers.

24. A semiconductor device according to any one of aspects 1 to 21, wherein the desired set of wavelengths is between 1000 and 1800 nanometers.

25. A semiconductor device according to any one of aspects 1 to 21, wherein the desired set of wavelengths is between 1260 and 1625 nanometers.

26. A semiconductor device according to any one of aspects 1 to 21, wherein the desired set of wavelengths is longer than 1800 nanometers.

27. A semiconductor device according to any one of aspects 1 to 21, wherein the desired set of wavelengths is longer than 100 nanometers.

28. A semiconductor device according to any one of aspects 1 to 21, wherein the desired set of wavelengths is longer than 500 nanometers.

29. A semiconductor device according to any one of aspects 1 to 21, wherein the desired set of wavelengths is longer than 1 micron.

31. A semiconductor device according to any one of aspects 1 to 21, wherein the desired set of wavelengths is longer than 1.5 microns.

32. A semiconductor device according to any one of aspects 1 to 21, wherein the desired set of wavelengths is longer than 2 microns.

33. A semiconductor device according to any one of aspects 1 to 21, wherein the desired set of wavelengths is shorter than 2 microns.

34. A semiconductor device according to any one of aspects 1 to 21, wherein the desired set of wavelengths is shorter than 1.3 microns.

35. A semiconductor device according to any one of aspects 1 to 21, wherein the desired set of wavelengths is shorter than 800 nanometers.

36. A semiconductor device according to any one of aspects 1 to 21, wherein the desired set of wavelengths is shorter than 400 nanometers.

37. A semiconductor device according to any one of aspects 1 to 21, wherein the desired set of wavelengths is between 100 nanometers to 2 microns.

38. A semiconductor device according to any one of aspects 1 to 21, wherein the desired set of wavelengths is between 300 and 1700 nanometers.

39. A semiconductor device according to any one of aspects 1 to 21, wherein the desired set of wavelengths is between 500 and 1500 nanometers.

40. A semiconductor device according to any one of aspects 1 to 21, wherein the desired set of wavelengths is between 700 and 1300 nanometers.

41. A semiconductor device according to any one of aspects 1 to 21, wherein the desired set of wavelengths is between 900 and 1100 nanometers.

42. A semiconductor device according to any one of aspects 1 to 21, wherein the desired set of wavelengths is between 1800 nanometers and 2 microns.

43. A semiconductor device according to any one of aspects 1 to 21, wherein the desired set of wavelengths is between 1500 nanometers and 2 microns.

44. A semiconductor device according to any one of aspects 1 to 21, wherein the desired set of wavelengths is between 1300 nanometers and 2 microns.

45. A semiconductor device according to any one of aspects 1 to 21, wherein the desired set of wavelengths is between 1 and 12 microns.

46. A semiconductor device according to any one of aspects 1 to 21, wherein the desired set of wavelengths is between 700 nanometers and 2 microns.

47. A semiconductor device according to any one of aspects 1 to 21, wherein the desired set of wavelengths is between 700 nanometers and 2 microns.

48. A semiconductor device according to any one of aspects 1 to 21, wherein the desired set of wavelengths is between 400 nanometers and 2 microns.

49. A semiconductor device according to any one of aspects 1 to 21, wherein the desired set of wavelengths is between 200 nanometers and 2 microns.

50. A semiconductor device according to any one of aspects 1 to 21, wherein the desired set of wavelengths is between 500 and 900 nanometers.

51. A semiconductor device according to any one of aspects 1 to 21, wherein the desired set of wavelengths is between 900 and 1400 nanometers.

52. A semiconductor device according to any one of aspects 1 to 21, wherein the desired set of wavelengths is between 1500 and 1700 nanometers.

53. A semiconductor device according to any one of aspects 1 to 21, wherein the desired set of wavelengths is between 1500 and 200 nanometers.

54. A semiconductor device according to any one of aspects 1 to 53, wherein the phonon donating material comprises a material with a hexagonal lattice.

55. A semiconductor device according to aspect 54, wherein the phonon donating material with a hexagonal lattice comprises a transition metal dichalcogenide.

56. A semiconductor device according to aspect 54, wherein the phonon donating material with a hexagonal lattice comprises graphite.

57. A semiconductor device according to any one of aspects 1 to 56, wherein the phonon donating material comprises a uniform bulk material.

58. A semiconductor device according to aspect 57, wherein the phonon donating material comprises multiple layers of transition metal dichalcogenides.

59. A semiconductor device according to any one of aspects 1 to 57, wherein the phonon donating material comprises multiple layers of graphite and transition metal dichalcogenides.

60. A semiconductor device according to any one of aspects 1 to 59, wherein the phonon donating material is configured to emit phonons isotropically.

61. A semiconductor device according to any one of aspects 1 to 60, further comprises a phonon guiding structure.

62. A semiconductor device according to any one of aspects 1 to 61, wherein the phonon donating material is selected to emit or absorb photons of a supplemental set of wavelengths.

63. A semiconductor device according to aspect 62, wherein the supplemental set of wavelengths of the phonon donating material is the same set of wavelengths as the desired set of wavelengths of the indirect bandgap material.

64. A semiconductor device according to aspect 62, wherein the supplemental set of wavelengths of the phonon donating material is a different set of wavelengths than the desired set of wavelengths of the indirect bandgap material.

65. A semiconductor device according to any one of aspects 1 to 64, wherein the electrical connection comprises a non-magnetic conductive transition metal.

66. A semiconductor device according to any one of aspects 1 to 65, wherein the semiconductor device is configured to absorb photons.

67. A semiconductor device according to aspect 66, wherein the indirect bandgap material comprises silicon.

68. A semiconductor device according to either aspect 66 or aspect 67, wherein the indirect bandgap material comprises germanium.

69. A semiconductor device according to any one of aspects 66 to 68, wherein the indirect bandgap material comprises a silicon carbide.

70. A semiconductor device according to any one of aspects 66 to 69, further comprising an anti-reflection measure.

71. A semiconductor device according to aspect 70, wherein the anti-reflection measure comprises an anti-reflection coating on one or more surfaces of the semiconductor device.

72. A semiconductor device according to either aspect 70 or aspect 71, wherein the anti-reflection measure comprises a textured surface of the semiconductor device.

73. A semiconductor device according to any one of aspects 66 to 72, wherein the indirect bandgap material comprises a plurality of layers of an indirect bandgap material, wherein the indirect bandgap material in each layer is either the same indirect bandgap material or one of a plurality of different indirect bandgap materials.

74. A semiconductor device according to aspect 73, wherein the phonon donating material comprises a plurality of layers of the phonon donating material, wherein the phonon donating material in each layer is either the same phonon donating material or one of a plurality of different phonon donating materials.

75. A semiconductor device according to aspect 74, wherein the multiple layers of phonon donating materials are each structurally connected to at least a one of the indirect bandgap materials and (i) configured to generate phonons, the phonons having frequencies that facilitate in the indirect bandgap materials the absorption of the photons of the desired set of wavelengths and (ii) to deliver the phonons to the indirect bandgap materials.

76. A semiconductor device according to any one of aspects 66 to 75, wherein the electrical connection comprises a first electrical connection on a first surface of the semiconductor device, and a second electrical connection on a second surface that comprises a metallic grid on the second surface.

77. A semiconductor device according to any one of aspects 66 to 75, wherein the electrical connection comprises a first electrical connection on a first surface of the semiconductor device that comprises a grid on the first surface, and a second electrical connection on a second surface that comprises a metallic grid on the second surface.

78. A semiconductor device according to any one of aspects 66 to 77, further comprising a heat sink coupled to a surface of the semiconductor device.

79. A semiconductor device according to any one of aspects 1 to 65, wherein the semiconductor device is configured to emit photons.

80. A semiconductor device according to aspect 79, wherein the indirect bandgap material comprises a silicon carbide.

81. A semiconductor device according to either aspect 79 or aspect 80, wherein the indirect bandgap material comprises gallium phosphide.

82. A semiconductor device according to any one of aspects 79 to 81, wherein the indirect bandgap material comprises boron nitride.

83. A semiconductor device according to any one of aspects 79 to 82, wherein the indirect bandgap material comprises a uniform bulk material.

84. A semiconductor device according to any one of aspects 79 to 83, wherein the indirect bandgap material comprises a plurality of layers of an indirect bandgap material, wherein the indirect bandgap material in each layer is either the same indirect bandgap material or one of a plurality of different indirect bandgap materials.

85. A semiconductor device according to aspect 84, wherein the phonon donating material comprises a plurality of layers of the phonon donating material, wherein the phonon donating material in each layer is either the same phonon donating material or one of a plurality of different phonon donating materials.

86. A semiconductor device according to aspect 84, wherein the multiple layers of phonon donating materials are each structurally connected to at least a one of the indirect bandgap materials and configured (i) to generate phonons, the phonons having frequencies that facilitate in the indirect bandgap materials the absorption of the photons of the desired set of wavelengths and (ii) to deliver the phonons to the indirect bandgap materials.

87. A semiconductor device according to any one of aspects 79 to 86, wherein the electrical connection comprises electrical leads configured to supply an electrical current to the semiconductor device.

The invention claimed is:

1. A semiconductor device comprising:
a non-amorphous indirect bandgap material;
a non-monolayer phonon donating material structurally connected to the non-amorphous indirect bandgap material and selected (i) to generate phonons having a band of wavenumbers that provide a momentum shift corresponding to a momentum mismatch of the non-amorphous indirect bandgap material, to facilitate in the non-amorphous indirect bandgap material the absorption or emission of photons of a desired set of wavelengths and (ii) to deliver the phonons to the non-amorphous indirect bandgap material; and
an electrical connection to the semiconductor device.

2. A semiconductor device according to claim 1, wherein the desired set of wavelengths is between 380 and 750 nanometers.

3. A semiconductor device according to claim 1, wherein the desired set of wavelengths is between 100 and 1300 nanometers.

4. A semiconductor device according to claim 1, wherein the desired set of wavelengths is shorter than 800 nanometers.

5. A semiconductor device according to claim 1, wherein the desired set of wavelengths is between 100 nanometers to 2 microns.

6. A semiconductor device according to claim 1, wherein the phonon donating material comprises a material with a hexagonal lattice.

7. A semiconductor device according to claim 6, wherein the phonon donating material with a hexagonal lattice comprises a transition metal dichalcogenide.

8. A semiconductor device according to claim 1, wherein the phonon donating material comprises a uniform bulk material.

9. A semiconductor device according to claim 1, wherein the phonon donating material comprises multiple layers of transition metal dichalcogenides.

10. A semiconductor device according to claim 1, wherein the phonon donating material comprises multiple layers of graphite and transition metal dichalcogenides.

11. A semiconductor device according to claim 1, wherein the phonon donating material is configured to emit phonons isotropically.

12. A semiconductor device according to claim 1, further comprising a phonon guiding structure.

13. A semiconductor device according to claim 1, wherein the phonon donating material emits and absorbs photons of a supplemental set of wavelengths.

14. A semiconductor device according to claim 13, wherein the supplemental set of wavelengths of the phonon donating material is a different set of wavelengths than the desired set of wavelengths of the indirect bandgap material.

15. A semiconductor device according to claim 1, wherein the electrical connection comprises a non-magnetic conductive transition metal.

16. A semiconductor device according to claim 1, wherein the indirect bandgap material comprises germanium.

17. A semiconductor device according to claim 1, wherein the indirect bandgap material comprises silicon.

18. A semiconductor device according to claim 1, further comprising an anti-reflection measure.

19. A semiconductor device according to claim 1, wherein the indirect bandgap material comprises a plurality of layers of an indirect bandgap material, wherein the indirect bandgap material in each layer is either the same indirect bandgap material or one of a plurality of different indirect bandgap materials.

20. A semiconductor device according to claim 19, wherein the phonon donating material comprises a plurality of layers of the phonon donating material, wherein the phonon donating material in each layer is either the same phonon donating material or one of a plurality of different phonon donating materials.

* * * * *